United States Patent
Gorobets et al.

(10) Patent No.: US 7,778,077 B2
(45) Date of Patent: *Aug. 17, 2010

(54) NON-VOLATILE MEMORY SYSTEM WITH END OF LIFE CALCULATION

(75) Inventors: Sergey Anatolievich Gorobets, Edinburgh (GB); Kevin M. Conley, San Jose, CA (US)

(73) Assignee: SanDisk Corporation, Milpitas, CA (US)

( * ) Notice: Subject to any disclaimer, the term of this patent is extended or adjusted under 35 U.S.C. 154(b) by 680 days.

This patent is subject to a terminal disclaimer.

(21) Appl. No.: 11/383,397

(22) Filed: May 15, 2006

(65) Prior Publication Data

US 2007/0263444 A1 Nov. 15, 2007

(51) Int. Cl.
*G11C 11/34* (2006.01)
(52) U.S. Cl. .......................... 365/185.09; 365/185.11; 365/200; 365/201
(58) Field of Classification Search .................. 365/201, 365/185.09, 185.17, 185.24, 185.33, 185.11, 365/200; 711/103; 714/704
See application file for complete search history.

(56) References Cited

U.S. PATENT DOCUMENTS

| | | | |
|---|---|---|---|
| 5,233,610 A * | 8/1993 | Nakayama et al. | 714/704 |
| 5,963,474 A | 10/1999 | Uno et al. | |
| 6,092,211 A * | 7/2000 | Hozumi | 713/500 |
| 6,092,221 A * | 7/2000 | Hiratsuka | 714/47 |
| 6,230,233 B1 * | 5/2001 | Lofgren et al. | 711/103 |
| 6,249,838 B1 | 6/2001 | Kon | |
| 6,643,187 B2 * | 11/2003 | Mokhlesi | 365/185.33 |
| 6,830,938 B1 | 12/2004 | Rodriguez et al. | |
| 6,993,690 B1 * | 1/2006 | Okamoto | 714/718 |
| 7,032,087 B1 | 4/2006 | Chang et al. | |
| 7,035,967 B2 * | 4/2006 | Chang et al. | 711/103 |

(Continued)

FOREIGN PATENT DOCUMENTS

WO 2006/013529 2/2006

OTHER PUBLICATIONS

Notification of Transmittal of the International Search Report and the Written Opinion of the International Searching Authority, or the Declaration, Int'l Appl. No. PCT/US2007/068605 mailed Feb. 14, 2008, 13 pages.

(Continued)

*Primary Examiner*—Dang T Nguyen
*Assistant Examiner*—Alexander Sofocleous
(74) *Attorney, Agent, or Firm*—Davis Wright Tremaine LLP (57) ABSTRACT

A system and methods are given for providing information on the amount of life remaining for a memory having a limited lifespan, such as a flash memory card. For example, it can provide a user with the amount of the memory's expected remaining lifetime in real time units (i.e., hours or days) or as a percentage of estimated initial life. An end of life warning can also be provided. In a particular embodiment, the amount of remaining life (either as a percentage or in real time units) can be based on the average number of erases per block, but augmented by the number of spare blocks or other parameters, so that an end of life warning is given if either the expected amount of remaining life falls below a certain level or the number of spare blocks falls below a safe level.

38 Claims, 6 Drawing Sheets

U.S. PATENT DOCUMENTS

| | | | |
|---|---|---|---|
| 7,120,729 | B2 | 10/2006 | Gonzalez et al. |
| 7,245,556 | B1 | 7/2007 | Pinto et al. |
| 7,464,306 | B1* | 12/2008 | Furuhjelm et al. .......... 714/710 |
| 2003/0002366 | A1 | 1/2003 | Mizoguchi et al. |
| 2003/0135793 | A1* | 7/2003 | Craig et al. ................... 714/42 |
| 2004/0083335 | A1* | 4/2004 | Gonzalez et al. ............ 711/103 |
| 2006/0139003 | A1* | 6/2006 | Fischer et al. ............... 320/132 |
| 2006/0156097 | A1* | 7/2006 | Camarce et al. ............. 714/724 |
| 2006/0245248 | A1* | 11/2006 | Hu ........................ 365/185.09 |
| 2007/0260811 | A1* | 11/2007 | Merry et al. ................. 711/103 |
| 2008/0082725 | A1* | 4/2008 | Elhamias ..................... 711/103 |
| 2008/0082726 | A1* | 4/2008 | Elhamias ..................... 711/103 |

OTHER PUBLICATIONS

Examiner's First Report, European Patent Application No. 07 783 548.6 dated Aug. 7, 2009, 2 pages.

* cited by examiner

| current # erase cycles | current # spare blocks | | |
|---|---|---|---|
| | >1 | 1 | 0 |
| <0.8N | (N-n)/N*100% | 5% | 0%, read only |
| 0.8N...N | (N-n)/N*100% | 5% | 0%, read only |
| >N | 0% | 0% | 0%, read only | flag EOL warning
▨

NON-VOLATILE MEMORY SYSTEM WITH END OF LIFE CALCULATION

CROSS-REFERENCE TO RELATED APPLICATION

The present application is related to U.S. application Ser. No. 11/383,384, of Sergey Anatolievich Gorobets and Kevin M. Conley, entitled "Non-Volatile Memory System with End of Life Calculation", which was filed on May 15, 2006, and is hereby incorporated herein, in its entirety, by this reference.

BACKGROUND OF THE INVENTION

The present invention relates generally to mass digital data storage systems, and, more particularly, to methods for non-volatile memories systems to determine and supply the user information on their remaining life.

The use of non-volatile memory systems such as flash memory storage systems is increasing due to the compact physical size of such memory systems, and the ability for non-volatile memory to be repetitively reprogrammed. The compact physical size of flash memory storage systems facilitates the use of such storage systems in devices, which are becoming increasingly prevalent. Devices that use flash memory storage systems include, but are not limited to, digital cameras, digital camcorders, digital music players, hand-held personal computers, and global positioning devices. The ability to repetitively reprogram non-volatile memory included in flash memory storage systems enables flash memory storage systems to be used and reused.

Although non-volatile memory or, more specifically, non-volatile memory storage cells within flash memory systems may be repetitively programmed and erased, each cell or physical location may only be erased a certain number of times before the cell wears out. In some systems, a cell may be erased up to approximately ten thousand times before the cell is considered to be unusable. In other systems, a cell may be erased up to approximately one hundred thousand times or even up to a million times before the cell is considered to be worn out. When a cell is worn out, thereby causing a loss of use or a significant degradation of performance to a portion of the overall storage volume of the flash memory system, a user of the flash memory system may be adversely affected, as for example through the loss of stored data or the inability to store data.

The wear on cells, or physical locations, within a flash memory system varies depending upon how often each of the cells is programmed. If a cell or, more generally, a memory element, is programmed once and then effectively never reprogrammed, the wear associated with that cell will generally be relatively low. However, if a cell is repetitively written to and erased, the wear associated with that cell will generally be relatively high. As logical block addresses (LBAs) are used by hosts, e.g., systems which access or use a flash memory system, to access data stored in a flash memory system, if a host repeatedly uses the same LBAs to write and overwrite data, the same physical locations or cells within the flash memory system are repeatedly written to and erased, as will be appreciated by those of skill in the art.

When some cells are effectively worn out while other cells are relatively unworn, the existence of the worn out cells generally compromises the overall performance of the flash memory system, which can be manifested in blocks which fail to program or erase (and eventually the system can run out of the blocks required to store data), or that have data unreliable upon reading. Although error correction techniques can be used, error correction takes time and, at some point, the system may reach a point when data storage reliability is unacceptable due uncorrectable errors or a high level of correctable errors causing excessive command (both read and write) execution latency. The system can reach this state even before it runs out of spare blocks due to program or erase block failures. In addition to degradation of performance associated with worn out cells themselves, the overall performance of the flash memory system may be adversely affected when an insufficient number of cells which are not worn out are available to store desired data. Often, a flash memory system may be deemed unusable when a critical number of worn out cells are present in the flash memory system, even when many other cells in the flash memory system are relatively unworn.

Although there are number of methods to increase the life of such memories, it would advantageous for the user to know how much life the memory has left before it is worn out and data is lost or it lapses into a read only mode. US patent application publication number US 2003/0002366 A1 describes a memory that generates a warning when number of spare storage areas is smaller than a predetermined value, but this warning is only given after the memory has reached this state and is based only the number of spare storage remaining areas at that time. It provides no evaluation based on a linearly increasing measure of wear nor indication of the remaining life as time. Consequently, there is room for improvement in providing the user with information on the state of memory and its remaining lifetime.

SUMMARY OF THE INVENTION

The present invention relates to a system and a method for providing information on the amount of life remaining for a memory having a limited lifespan. Such an end of life indication feature for a memory, such as a flash memory card, can have various forms. For example, it can provide a user with the amount of the memory's expected remaining lifetime in real time units (i.e., hours or days). Alternately, or in addition, the device's expected remaining life can be expressed as a percentage of estimated total life. In either case, the system may also provide an end of life warning, indicating that the card or device has reached some relatively advanced state of wear, such as when, say, 80% or 95% of its life is over. The system could report this information to the user by a status bar or other warning; additionally, the warning may trigger to host to take various actions, such as activating back-up procedures or shutting down applications.

According to a first aspect, the present invention the memory card (or other device) maintains a parameter or some other indication of its wear level. In an exemplary embodiment, this can be related to the "hot count" or "experience count" indicating how many rewrite cycles the memory cells have undergone; for example, in a memory with a erase block structure, the parameter could be the average number of erases per block or, in a memory with a cyclic wear leveling pointer, this could be the number of times the pointer has wrapped around (or, more generally, a function of this parameter). Another parameter that can be used, either alone or in combination with the number of rewrites, is the number of spare memory blocks. The adjustment can also be based on cell behavior (such as block failure rate), ECC results (such the number or magnitude of errors per unit of data or the frequency of such ECC error detections), program or erase time, or other characteristics related to cell age. In a particular embodiment, the amount of remaining life (either as a percentage or in real time units) can be based on the average number of erases per block, but augmented by the number of spare blocks or other parameters, so that an end of life warning is given if either the expected amount of remaining life falls below a certain level or the number of spare blocks falls below a safe level. In one embodiment, in the event of no spare erase blocks being left or other end of life criterion being met, the device can lapse into a read only mode or otherwise change its behavior.

According to another set of aspects, the present invention can update its estimate of remaining life based on usage patterns or other information. For example, the card can determine a first estimate of life remaining, but as the card continues to be used, this estimate can be revised. In one set of embodiments, card usage can be monitored (by the host, for example) and usage patterns can be used to decide whether the card is aging more quickly or more slowly than initially estimated. (This is only needed for time-based estimates.)

In a further set of embodiments, the host can calibrate the card's lifetime. In this arrangement, the host can send time values to the card that, when combined with the amount of remaining lifetime maintained on the card as a percentage, can be used to estimate the amount of remaining life in real time units. This removes the dependence on a real-time system clock internal to the memory device. In other embodiments, the amount of wear as a percentage can be sent to the host, which then calculates the remaining life in real time units itself.

Additional aspects, advantages and features of the present invention are included in the following description of exemplary examples thereof. All patents, patent applications, articles, patent publications and other publications referenced herein are hereby incorporated herein in their entirety for all purposes.

BRIEF DESCRIPTION OF THE DRAWINGS

The invention may best be understood by reference to the following description taken in conjunction with the accompanying drawings in which:

FIG. 1b is a diagrammatic representation of a memory system, e.g., memory device 120 of FIG. 1a.

DETAILED DESCRIPTION OF EXEMPLARY EMBODIMENTS

The present invention is related to providing the user with information of on the remaining lifetime and End of Life (EOL) information for a memory card or other memory device of limited lifetime. While the embodiments described herein describe non-volatile EEPROM based memory systems, the various aspects of the present inventions are applicable to any type of storage medium susceptible to "wear". For example, an emerging type of non-volatile memory technology is phase-change memory. Information is stored by changing the phase of a given material. A number of other examples of such systems are given in U.S. patent application Ser. No. 10/841,379. Such systems also may be prone to "wear", where the storage medium is less capable of storing information as the number of times the medium has been cycled increases. The present inventions can be readily applied to such technologies.

A number of methods of improving memory life are known, such as using "gentler" operating values or algorithms (such as in intelligent erase or programming processes), wear leveling (described, for example, in U.S. patent application Ser. No. 10/686,399), using margin values (described, for example, in U.S. Pat. No. 5,532,962), operating multilevel memories in a binary mode (described, for example, in U.S. Pat. No. 6,456,528), or methods of encoding and storing the data (such as described in U.S. patent application Ser. Nos. 11/321,217 and 11/320,916). Although these and other techniques can improve how long the memory will last, it will still, eventually, reach a point of unacceptable remaining usable capacity (due to the block failures) or performance (speed, reliability). It would be of great utility to users to have some indication of when this is likely to occur, allowing them to plan accordingly.

The present invention has a number of aspects and embodiments. According to a first of these, a memory card or other memory device can provide the user with the amount of life remaining in terms of time units (hours, days). In another embodiment, the card can provide the amount of life it has remaining in terms of a percentage of its initial that remains. In either option, the memory can also provide an EOL Warning, which is an indication that the card reached some relative ages, say 80 or 95% of life is over. Although the discussion is primarily given using a memory card-type embodiment, the various aspects of the present invention can be implemented for memory system that can be detachably connected to a host (such as memory cards, USB devices, and so on), embedded memory systems, etc.

The present invention provides several methods for calculating a relative end of life. For example, the percentage of remaining life can be base on the number of erases per memory block or adjustable if the number of spare blocks becomes too low. As mentioned above, in the other embodiments the adjustment can be made according to the error rate upon reads, program and erase time, block failure rate etc. These methods can also provide for an EOL warning flag. The calculation of a memories remaining life in real units of time can be made by the card based on calibration information from the host or on measurements made by the host, among other methods. In other aspects of the invention, a number ways to display the end of life information are presented.

A. Memory Organization and Basic Definitions

Figure 1A:
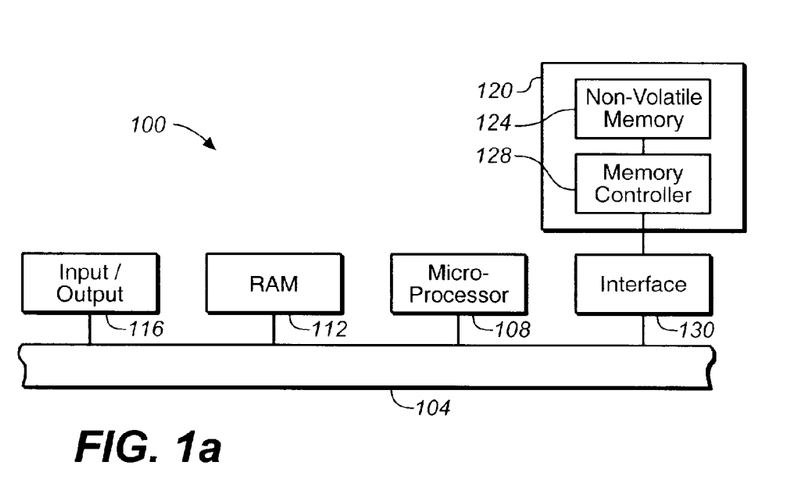
FIG. 1a is a diagrammatic representation of a general host system which includes a non-volatile memory device.

Referring initially to FIG. 1a, a general host system that includes a non-volatile memory device, e.g., a memory card such as a CompactFlash memory card, will be described. A host or computer system 100 generally includes a system bus 104 that allows a microprocessor 108, a random access memory (RAM) 112, and input/output circuits 116 to communicate. It should be appreciated that host system 100 may generally include other components, e.g., display devices and networking device, which are not shown for purposes of illustration.

In general, host system 100 may be capable of capturing or storing information including, but not limited to, still image information, audio information, video image information or other types of data. Such information may be captured in real-time, and may be transmitted to host system 100 in a wireless manner. While host system 100 may be substantially any system, host system 100 is typically a system such as a digital camera, a video camera, a cellular communications device, portable computing device, an audio player, or a video player. It should be appreciated, however, that host system 100 may generally be substantially any system which stores data or information, and retrieves data or information. It may also be a system that either only captures data or only retrieves data. That is, host system 100 may be a dedicated system that stores data, or host system 100 may be a dedicated system which reads data. By way of example, host system 100 may be a memory writer that is arranged only to write or store data. Alternatively, host system 100 may be a device such as an MP3 player that is typically arranged to read or retrieve data, and not to capture data.

A non-volatile memory device 120 is arranged to interface with bus 104 to store information. An optional interface circuit block 130 may allow non-volatile memory device 120 to communicate with bus 104. When present, interface circuit block 130, e.g., and interface, serves to reduce loading on bus 104. Non-volatile memory device 120 includes non-volatile memory 124 and a memory control system 128. In one embodiment, non-volatile memory device 120 may be implemented on a single chip or a die. Alternatively, non-volatile memory device 120 may be implemented on a multi-chip module, or as multiple discrete components. One embodiment of a non-volatile memory device 120 will be described below in more detail with respect to FIG. 1b. Non-volatile memory device 120 may be substantially any suitable non-volatile memory device, e.g., a removable memory card or an embedded sub-system.

Non-volatile memory 124 is arranged to store data such that data may be accessed and read as needed. The processes of storing data, reading data, and erasing data are generally controlled by memory control system 128. In one embodiment, memory control system 128 manages the operation of non-volatile memory 124 such that its lifetime is substantially maximized by essentially causing the different sections of non-volatile memory 124 to be worn out at substantially the same rate. For example, the memory controller can implement one of many wear leveling techniques such as recycling blocks with low wear with those in areas experiencing active wear. Some examples of wear leveling techniques are given in U.S. patent application Ser. No. 10/990,189, filed Nov. 15, 2004.

Non-volatile memory device 120 has generally been described as including a memory control system 128, i.e., a controller. Specifically, non-volatile memory device 120 may include separate chips for non-volatile memory 124 and controller 128 functions. By way of example, while non-volatile memory devices including, but not limited to, PC cards, CompactFlash cards, MultiMedia cards, and Secure Digital cards include controllers which may be implemented on a separate chip, other non-volatile memory devices may not include controllers that are implemented on a separate chip. In an embodiment in which non-volatile memory device 120 does not include separate memory and controller chips, the memory and controller functions may be integrated into a single chip. Additionally, the controller may be located on the host system, and the non-volatile memory device 120 connected to the controller on the host through a connector or any other type of interface. Regardless, the scope of the present inventions encompasses all different forms and combinations of a memory system, wherein the level of wear within a memory medium is controlled by a control system. For example, the controller may be implemented within software on the microprocessor of the host system.

Figure 1B:
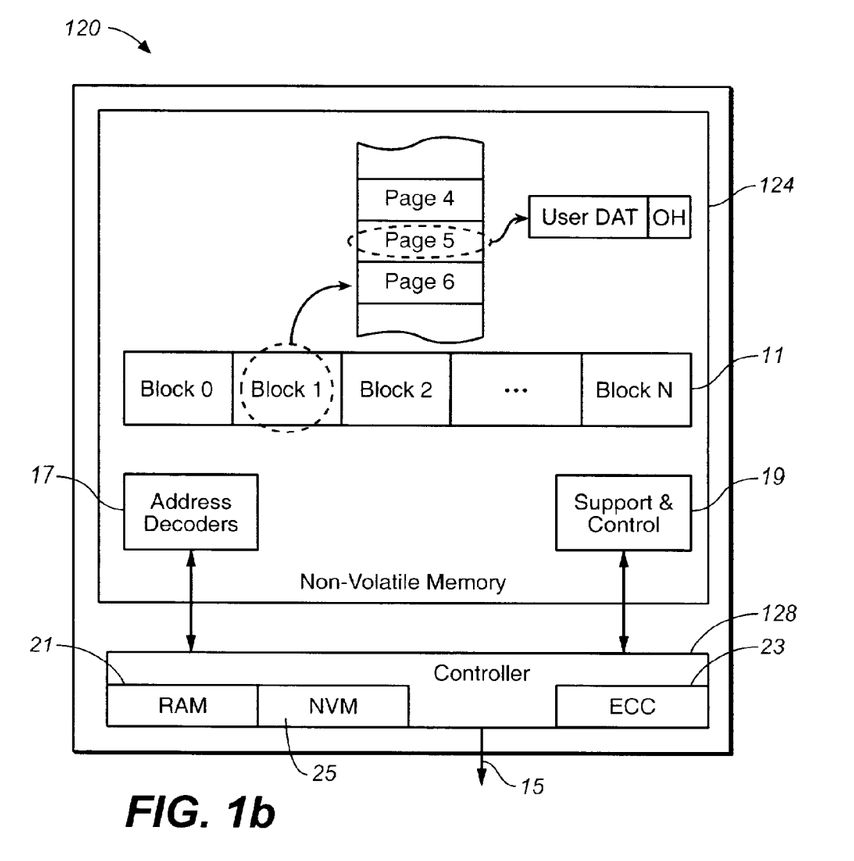

With reference to FIG. 1b, one example of a non-volatile memory device 120 will be described in more detail. It should be appreciated that FIG. 1b shows an embodiment of non-volatile memory device 120 that includes a single flash memory chip 124 and a separate controller 128. Memory 124 may be an array of memory cells along with suitable addressing and control circuitry formed on a semiconductor substrate, wherein one or more bits of data are stored in the individual memory cells by storing one of two or more levels or distributions of charge in individual memory elements of the memory cells. A non-volatile flash electrically erasable programmable read only memory (EEPROM) is an example of a common type of memory for such systems.

In the described embodiment, controller 128 communicates over a bus 15 to a host computer or other system that is using the memory system to store data. Bus 15 is generally a part of bus 104 of FIG. 1a. Control system 128 also controls operation of memory 124, which may include a memory cell array 11, to write data provided by the host, read data requested by the host and perform various housekeeping functions in operating memory 124. Control system 128 may include a general-purpose microprocessor or microcontroller that has associated memory, various logic circuits, and the like. One or more state machines are often also included for controlling the performance of specific routines.

Memory cell array 11 is typically addressed by control system 128 through address decoders 17. Decoders 17 may apply the correct voltages to word and bit lines of array 11 in order to program data to, read data from, or erase a group of memory cells being addressed by the control system 128. Additional circuits 19 may include data registers to temporarily store data being read or written, programming drivers that control voltages applied to elements of the array that depend upon the data being programmed into an addressed group of cells, and state machines to control sequencing of the various voltages and control signals. These support and control circuits 19 may also include some amount of non-volatile memory for counters or other control information. Circuits 19 may also include sense amplifiers and other circuits necessary to read data from an addressed group of memory cells. Data to be programmed into array 11, or data recently read from array 11, are typically stored in a buffer memory 21 within control system 128. Control system 128 also usually contains various registers for temporarily storing command and status data, and the like. Control system 128 may also include some amount of non-volatile memory 25 where it can store various control data that it wants to maintain even when powered down. In other cases, the control system 128 may keep any such permanent records in non-volatile memory 124.

In one particular embodiment, array 11 is divided into a large number of BLOCKS 0-N of memory cells. In the preferred embodiment, a block is a unit of erase, the minimum number of memory cells that are erased together. Each block is typically divided into a number of pages, as also illustrated in FIG. 1b. A page is the minimum unit of programming and one or more sectors of user data are typically stored within each page. A sector is the smallest unit of logical data that the host will address or transfer to or from the non-volatile memory. In disk drive applications, this is typically 512 bytes. Some non-volatile memories allow partial page programming in which the individual bits remaining in an erased state after a first programming can be programmed in subsequent page program operations without first erasing the page. Some multistate memories may even allow bits already programmed in a lower programmed state to be programmed into a higher state in subsequent page program operations. In these memories, sectors, or even portions of sectors may be programmed at different times. Nevertheless, one page remains the basic unit of programming; it is just that some bits may be masked out and programmed later. The present inventions can be applied to any suitable memory system regardless of the physical implementation of the units of erase, read and/or write.

As shown in FIG. 1b of the described embodiment, one page may include both user data and overhead data. Overhead data typically includes an error correction code (ECC) that has been calculated from the user data contained in the page, and the ECC may include some or all of the overhead data. A portion 23 of the control system 128 calculates the ECC when data is being programmed into array 11, and also checks the ECC when data is being read from array 11. Overhead data may also include the logical address of the user data, the physical addresses of the page and/or block, address map information, the number of erase cycles experienced by the physical block, encryption information and/or other statistics or data. Part or all of the overhead data may be stored in each page, as illustrated in FIG. 1b. Alternately part or all of the overhead data may be stored in a specific location within each block, or it may even be stored in a block separate from the user data. The ECC stored in the overhead data can be used to give some indication of the reliability of associated data read by indicating the number of bits in error. The memory system controller can track the frequency and magnitude of such errors. This information provides a parameter by which the wear of a group of cells can be inferred.

One sector of data is most commonly included in each page but two or more sectors may instead form a page, or a page may be smaller than a sector. For example, U.S. Pat. Nos. 5,890,192 and 5,430,859 describe programming and reading data in units of chunks, in which a chunk is a fraction of a sector. In some memory systems, one sector is included in one page, and one page may form a block. More commonly, in NAND memory systems one or more sectors are included in each page, and 8, 16, or 32 pages form a block. In other memory systems blocks are formed from a relatively large number or pages such as 512, 1024, or even more pages. The number of blocks is chosen to provide a desired data storage capacity for the memory system. Array 11 is typically divided into a few sub-arrays (not shown), each of which contains a proportion of the blocks, which operate somewhat independently of each other in order to increase the degree of parallelism in the execution of various memory operations. An example of the use of multiple sub-arrays is described in U.S. Pat. No. 5,890,192, referenced earlier.

The tracking algorithm and various end of life techniques described in more detail in the following sections are carried on the controller 128 using its CPU (not explicitly shown), although some of the operations can be executed on the memory 124, depending on the capabilities it includes. The ECC hardware and software 23 provides quantity information (number and magnitude of errors, or number of error bits) about errors based on, for example, BCH or Reed-Solomon methods. A card interface will allow the various EOL information to be reported out to the host and, in implementation where it is required, time to be communicated from the host to the storage device.

B. Relative End of Life Calculations: Main Principles

The Relative EOL Calculation method gives an approximate remaining lifetime of the card, expressed in percentage of total lifetime. Memories usually maintain an "experience count" or "hot count" expressing the number erase-program cycles the memory has experienced. An average hot count can be calculated by simply counting all of the erase operations and dividing the value by the number of blocks. For example, in the memory systems described in US patent publications numbers US-2005-0144360-A1, US-2005-0141313-A1, US-2005-0141312-A1, US-2005-0166087-A1, and US-2005-0144365-A1, which can be taken as the exemplary embodiment for following description, this would be the number of blocks in the MML space. Alternatively, in systems using a wear leveling cyclic pointer, this can be done by counting the number of times the wear leveling cyclic pointer wraps around the card. For example, in the Cyclic Wear Leveling method described in U.S. Pat. No. 6,230,233 U.S. patent applications Ser. Nos. 10/990,189, 10/686,399, and 10/281,739, every count will be a function (typically linear) of X average erases per, where X is the number of erases performed between Wear Leveling Exchange operation. The current number of spare meta-blocks, or other logical or physical units of erase, can also be taken into account. If the number of spares (or program or erase time) falls down (or error rate goes up) dramatically, the "percentage of life" calculated on the basis of average hot count can be adjusted.

Figure 2:
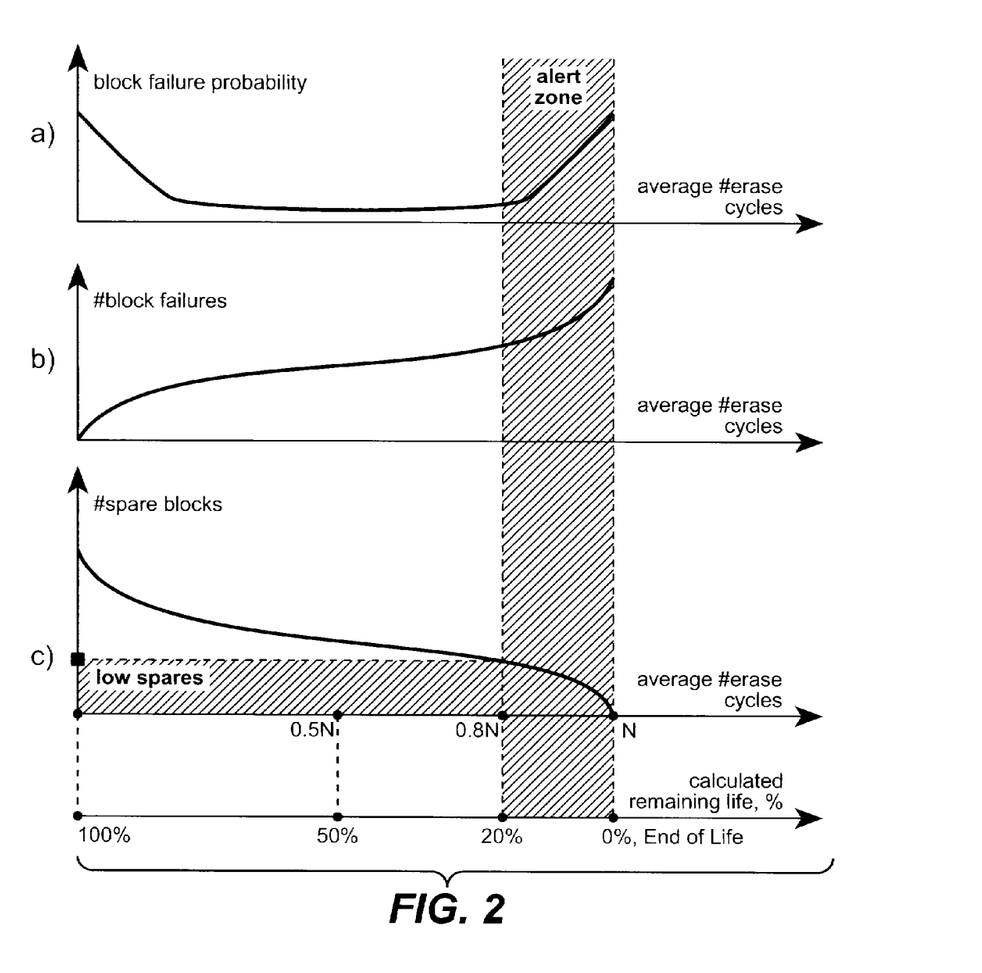
FIG. 2 shows a typical case of an end of life calculation.
Figure 3:
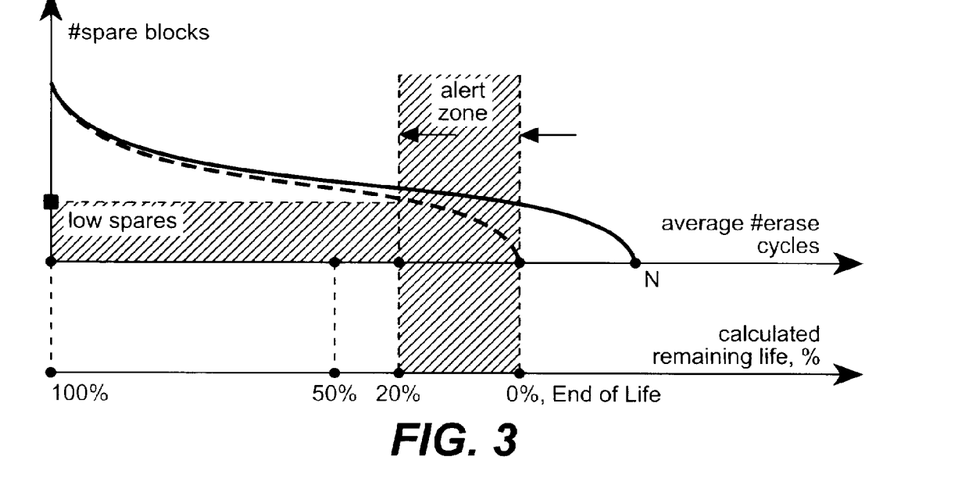
FIG. 3 shows the case where the degradation of memory blocks is faster than expected.

Some of the main principles of an end of life (EOL) calculation are illustrated in FIGS. 2a-c and 3, where FIGS. 2a-c show a typical end of life case and FIG. 3 the situation when the memory blocks degrade faster than expected. In this particular example, the adjustments will be made based on only the number of block failures and number of spare blocks. More generally, other parameters (error rate, program or erase time, etc.) can be taken into account. In the typical case, the block failure probability (FIG. 2a) has a bath tub dependency on the number of average block erase cycles, where the upraising steep slope is specific to the memory type (floating gate EEPROM, dielectric, etc.) and conditions, such as operating voltage and temperature. In an initial phase, weak or defective cells will fail relatively rapidly, after which the probability will stay more or less flat through most of the device's life. As the memory cells begin to wear out, the probability will steepen as the end of life is approached and the alert zone entered. The EOL calculation method is based on the usage of this dependency, which can also be presented in another form, as a dependency of number of failed blocks on the number of average block erase cycles (FIG. 2b). For every given product, the typical, or worst case, dependency should be known in order to make a realistic EOL calculation.

FIG. 2c shows this same information in terms of the number of spare blocks remaining on the device. In addition to showing an alert zone base on a percentage (here, 80%) of lifetime elapsed, FIG. 2c also shows a range ("low spares") where the number of available spare blocks becomes dangerously low.

FIGS. 2a-c show the case where the memory device follows the expected degradation pattern. More generally, however, the rate of degradation may differ from the expected level or change as the device is operated. For example, part way through its life the device may be used in more extreme operating conditions, resulting in an increased rate of deterioration. This is shown in FIG. 3. The solid line is the same as shown in FIG. 2c, the broken line the shifted value due to faster deterioration. As can be seen, the degradation rate starts as expected, but then increases more rapidly than would be expected based just on the standard number of expected erase cycles.

The EOL calculation is based on a comparison of the current number of average block erases n to the maximum number of block erases N, where N is an expected realistic, or worst case, number of erase cycles average block on the card can stand. N highly depends on the memory type; the voltage range; the operating temperature range; access patterns; and initial number of spare blocks, among other things. The main problem is to get a reasonably accurate block failure dependency as a function of the parameters. The remaining card's life is normally calculated in percent relative to N:

Remaining life, %=$(N-n)/N*100$%.

For example, if n is 0.8N, then Remaining Life=20%.

Another way of indicating EOL can be indication that card reached certain level of wear. In this example, an EOL Warning is flagged when the card is believed to be 80 percent worn out and the card is in the "alert" working zone. The warning flag can be set internally and will be indicated to the host if a special command is issued. If the average number of erase cycles reaches N, then 0% remaining life should be indicated while the card should keep working fully until it runs out of spare blocks. When the card runs out of spare blocks it should go to a Read-Only mode.

In addition to the erase cycle based calculation, the EOL calculation can be adjusted if the ongoing degradation of blocks on the card diverges from the expected block failure distribution, such as is shown in FIG. 3. FIG. 3 illustrates that in this case the alert can be triggered not by the high number of erase cycles per block, but by the low level of remaining spare blocks. Thus, the EOL calculation based on the number of erased cycles is corrected to match the real state of the card. The simplest implementation can be just setting the low EOL value, say 5 percent, and alert if there is only one spare block left. The EOL calculation in this case will follow the rules summarized in the table of FIG. 4.

Figure 4:
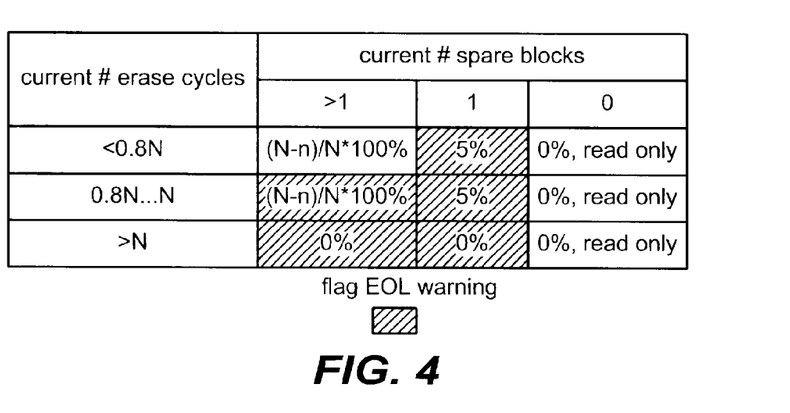
FIG. 4 shows an exemplary embodiment for an end of life calculation

FIG. 4 shows one particular embodiment of the end of life calculation that takes into account both the number of erase cycles that the memory has been through and the number of spare blocks. The number of erase cycles will increase continuously with the number of accesses, while the number of spare blocks will decrease discontinuously. The rows correspond to the number of erase cycles expressed in terms of the expected lifetime, N, where N can be updated as the device is operated, being increased or decreased depending on usage. The first row is the safe range of less than 0.8N, the second row the alert zone of 0.8N to N, and the bottom row for when the expected lifetime has been reached. The first column is for when more than spare block remains, in which case the lifetime is expressed as the expected percentage remaining. The second column is for when only a single spare block remains, in which case the lifetime is set to default value of 5%, unless N is reached, in which case this value is overridden and set to 0%. The last column is for when no spare blocks remain, in which case the lifetime is taken as 0% and the device will, in the exemplary embodiment, lapse into a read only mode. The upper left corner is the safe operating zone, with the rest of the first column and all of the second column the alert zone when the EOL flag will be set, with the device further going into read only mode in the last column.

More generally, based on one or more end of life criteria being met or approached, the memory of the various embodiments described can change its behavior in one or more ways. In addition to going into a read only mode or change its behavior, the memory could slow down various operations, vary their algorithms, reduce the number of special purpose blocks (such as the update blocks in the exemplary embodiment in US patent publication US-2005-0144365-A1), and so on.

Upon receiving end of life information, the system can inform or warn the user in a number of ways. For example, it can provide this information to the user through a status bar and update this display as the end of life estimate is updated. In addition to any actions that the user may take based on this information, depending on the embodiment the host itself can take steps itself. For example, the warning can be passed with the host's operating system or to various applications. This can then lead to the activation of back-up processes or the shut-down of the application, part or all of the host system.

As mentioned above, although the embodiments described above uses the number of erases, the number of spare blocks, or a combination of these, other parameters can also be used in combination with or instead of these parameters as a metric for age. For example, the adjustment could also be based on memory cell behavior by incorporating things such as block failure rate (based on, say, the distance between program and/or erase failures), ECC results, the program or erase time, or other characteristics that indicate cell age. The ECC results that can be used can include the number of errors, either maximum or per unit of data, the magnitude of these errors (if the ECC method used supplies these), the frequency of such errors, or some combination of these.

Even when there are no read error under normal conditions, margin reads (such as those described in U.S. Pat. No. 5,532, 962) can be employed to estimate data retention quality, where the various reference voltages can be provided from the controller, the memory chip itself, another memory chip, or ever the host according to various embodiments. These various adjustment parameters can be individually used as the only estimation parameters for EOL. For example, number of spare blocks alone can be used alone to judge the EOL. Also, there is often a correlation, or even overlap, between the various parameters, but a better result can often be achieved by taking into account more parameters. For example, there may be plenty of spare blocks, but slow programming speed, which would indicate that the EOL is near. In the hypothetical case of identical cells, all of these ideal cells would fail at the same time and would show the same error rate upon data reads. Also, there may be spares, and program time is not too long, but error rate is high. This would similarly indicate that EOL is near due to poor data retention.

C. End of Life Calculation in Time Units—Main Principles

The EOL calculation in time units, such as hours, days and weeks, can be based on the usage pattern and access frequency of the card. In the case of an even usage pattern, the calculation of remaining life in time units can be done if there is a system clock and the card's usage rate is measured. In the example below, the remaining life in hours can be calculated as a function of the current number of erase cycles per block n and the current number of erases per block per day:

Remaining Life(hours)=$(N-n)/(N*$#erases per block per hour).

Figure 5:
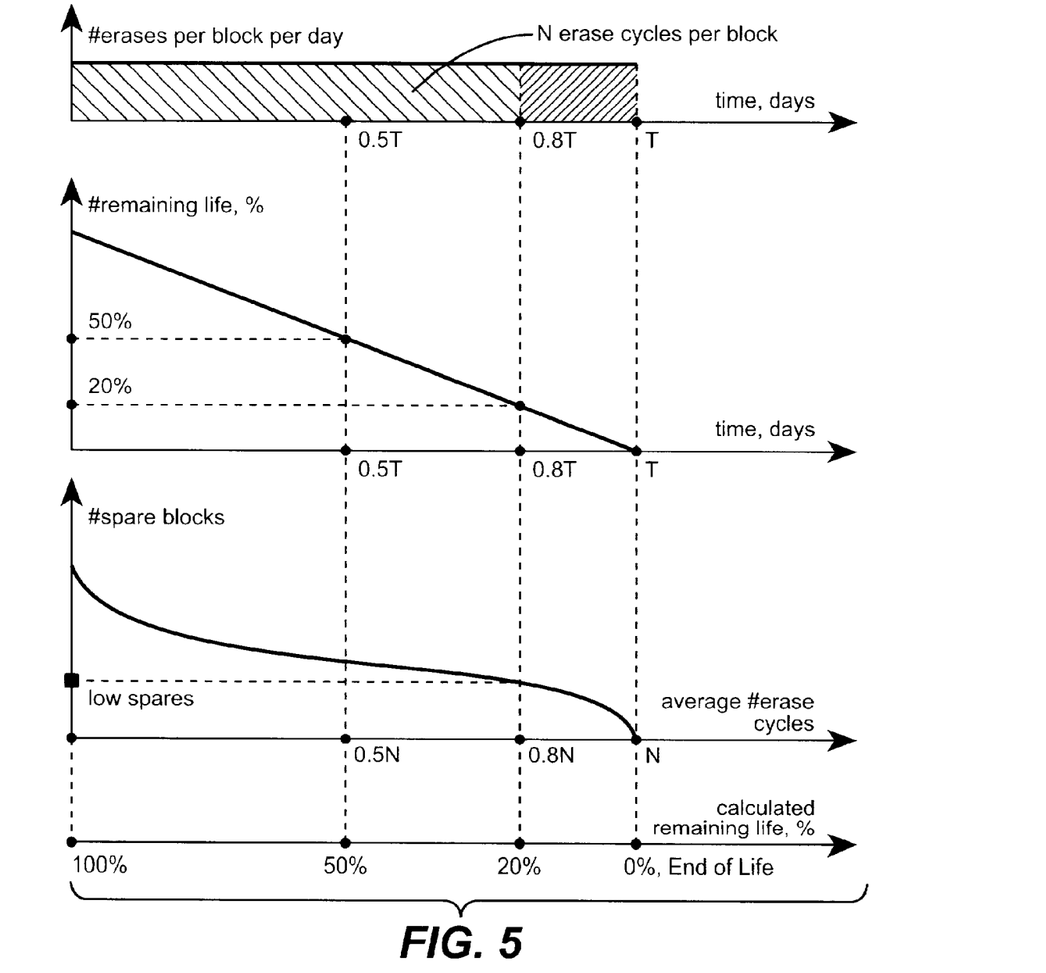
FIG. 5 illustrates even usage of a memory device.

In this case, the time T as shown in FIG. 5 is overall card's life which corresponds to the state when card reaches the level of N average erases per block. Similarly, the level of 20% of life still remaining will mean that the card's remaining lifetime is 0.2T.

FIG. 5 shows the constant rate of aging situation, either due to even usage and consistent operating conditions or as an approximation of a more complicated situation. The top part of FIG. 5 show the usage rate, here taken as even throughout the lifetime, where the alert zone is taken as when 80% of the card's lifetime (0.8T) has elapsed. The upper graph is a straight line indicative of even wear, while lower graph shows the number of spare blocks.

Figure 6:
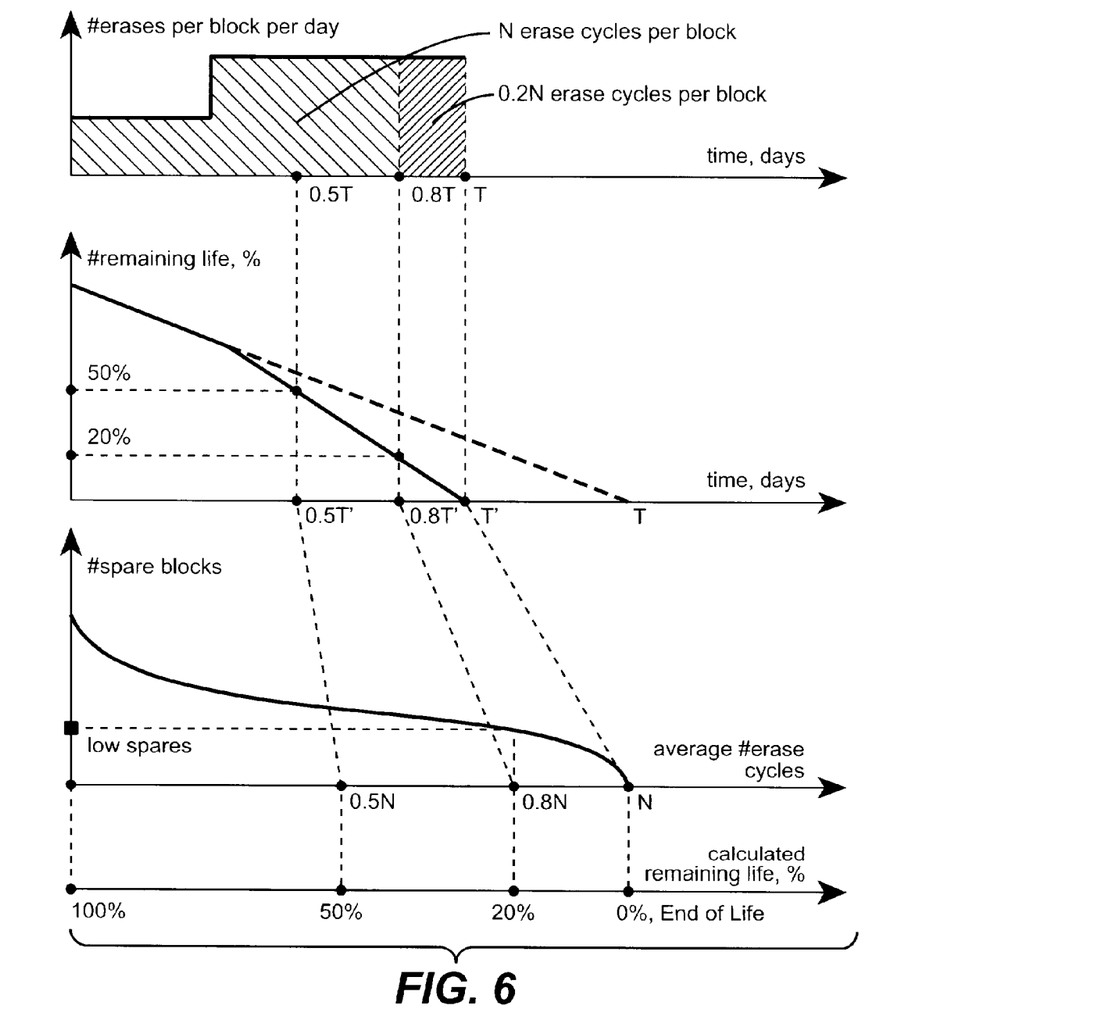
FIG. 6 illustrates uneven usage of a memory device.

If the card's usage is uneven, then the EOL calculation based on the current usage rate can be adjusted to match the changes in the usage rate. FIG. 6 illustrates the case when the card's usage rate increases and the calculation of the end of life time T is recalculated to the new value T' as the card is expected to reach the level of N erases per block much sooner.

As shown at the top portion of FIG. 6, the usage level (in terms of number of erases per day) in this example is taken as constant at a first level for about the first third of the expected lifetime, when it then increases to a higher rate of usage. As the rate of usage (number of erases per block per day) increases, the percentage of remaining life will decrease more rapidly. This is reflected in the remaining life graph, which begins at a first, constant slope. If the usage remained even, this would continue on as shown in the broken line. Due to the increased number of erases, the slope instead steepens, reflecting shorter expected lifetime. The alert zone will again be triggered at 0.8T. Although this is now sooner, it may be that the number of decreases at the same rate as for the even usage case, as shown in the bottom graph of FIG. 6.

In order to express the amount of lifetime remaining in real time units, the above method needs some time reference, such as system clock, in order to measure the current usage rate. In cases where the card's usage has a periodic pattern, then it may be difficult for the card to recognize the pattern and make an accurate EOL calculation. The following section describes one embodiment of calculating the remaining life in time units in a card which has no system clock.

D. Calibration by Host

Figure 7:
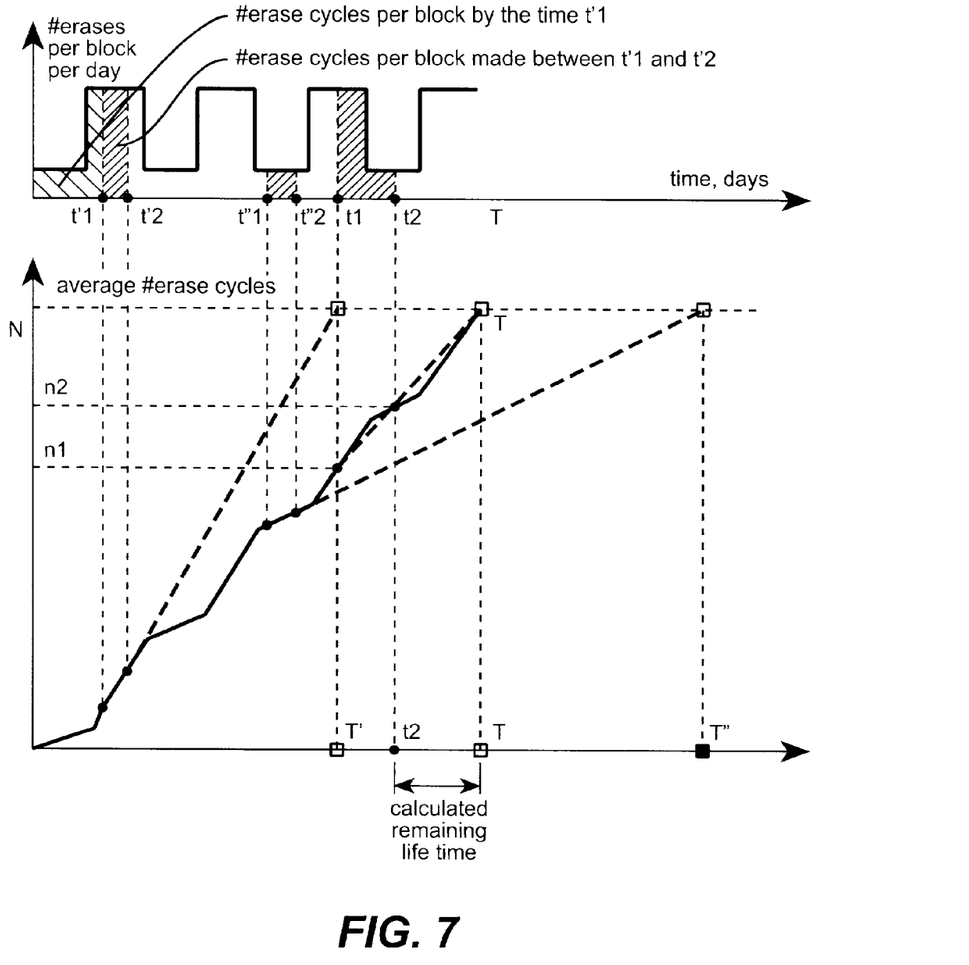
FIG. 7 shows calibration and end of life calculation in time units.

In the calibration by host embodiment, the host, which has a real-time system clock, can use a special command to send current time values to the card. Also, if timing information is present in the standard working mode (for example, if the file attributes contain time of the last update in the file itself and/or in the directory record for the file), this information can be extracted by the system without special command. The simplest example would be to monitor directory updates and check the time/date information for the file entries. The card can then use those values to calculate the current usage rate and then the remaining card's lifetime. FIG. 7 illustrates the method in the case when the card's usage has a periodic pattern, which is a typical case for many applications, for example network hubs, where the usage pattern has specific highs and lows during the day or week. In order to do an accurate measurement, the host sends the current time values at least twice, say at time $t_1$ and $t_2$. The card needs to store the average number of erase cycles per block $n_1$ and $n_2$ experienced by the card by time $t_1$ and $t_2$, correspondingly, as well as the time values themselves. The remaining life can then be calculated as:

$$\text{Remaining life(days)} = T - t_2 = (N - n_2)*(t_2 - t_1)/(n_2 - n_1),$$

where N is the expected maximum number of erases per block, and T is the expected end of life time. Then, the estimation for remaining card's life can be read by the host with a special command. A simple implementation would be to use a single command to send the new current time value and read the new estimation of remaining lifetime.

FIG. 7 shows the estimated lifetime being adjusted several times based to reflect usage. It also shows how this updating can be used accurately and inaccurately. In the exemplary embodiment, the reference time period between two commands would cover at least one typical period of the card's usage. If the period between two commands is too short then the calculation can be inaccurate. As is illustrated in FIG. 7, if the commands are issued during usage high ($t'_1$ and $t'_2$) or low ($t''_1$ and $t''_2$), the end of lifetime calculation (T' and T'' correspondingly) can be far from the correct one (T). If the host application issues the command, say at the same time once a week, the EOL calculation can be more accurate. The use of times $t_1$ and $t_2$ reflect a choice that reflects a more accurate choice of a sample period. The assumption here is that the host has some knowledge of the typical usage pattern, or at least the period of the pattern, better then the card.

E. "Real time" EOL Measurement by the Host and Further Improvements

An alternative method can be based on doing the usage rate measurements by the host itself. In this case, the host periodically reads relative remaining life values in percentages $1_1$ and $1_2$ from the card at time $t_1$ and $t_2$. The host's application use these values and times and do the following calculation:

$$\text{Remaining life(days)} = 1_2*(t_2 - t_1)/(1_2 - 1_1).$$

Thus, the card with an EOL calculation in percentages only can be used to provide the EOL calculation in time units.

The various aspects of the present invention can be extended to include a number of further improvements. For example, as the card or other memory device can be used in different application, the "real time" EOL measurement based on any of these methods can be supported by a special host utility. The host utility can issue the time value or perform the EOL calculation itself. Such a utility can support multiple cards identifiable by, say, some ID. For example, photo professionals can use such a utility on weekly basis and read the remaining life values from their cards.

Additionally, although the above discussion has considered the case where, in addition to the number of erase cycles, only the current number of spare blocks or meta-blocks is considered, other aspects affecting the EOL calculation can also be included. For example, the host's peak write rate can also be included in the EOL calculation. Further, as mentioned above, other parameters like error rate (with or without special margins), program/erase time, ECC results, or other methods can be incorporated. These various indications of device age can be used alone or variously combined to provide accurate indications of a device remaining lifetime according to its use.

Therefore, the present examples are to be considered as illustrative and not restrictive, and the invention is not to be limited to the details given herein, but may be modified within the scope of the appended claims.

The invention claimed is:

1. A non-volatile memory system, comprising:
   a plurality of rewritable memory cells, where the memory cells each have a lifetime of a finite number of rewrite cycles;
   rewrite circuitry connectable to said memory cells whereby the memory cells can be rewritten; and
   control circuitry that maintains a parameter indicative of the number of rewrites the memory cells have undergone, determines an indication of the expected amount of remaining lifetime of the memory system based on the value of said parameter, and provides said indication of the expected amount of remaining lifetime to a host to which the memory is connected,
   wherein, subsequent to providing said indication of the expected amount of remaining lifetime to a host, said control circuitry monitors the usage pattern of the memory system during operating and revises the expected amount of remaining lifetime of the memory system based on said usage pattern, and wherein when the memory system is attached to a host, said monitoring the usage pattern is performed using a current time value from the host.

2. The system of claim 1, said memory further comprising:
a system clock, wherein said monitoring the usage pattern is performed using the system clock of the memory system.

3. The non-volatile memory system of claim 1, wherein said parameter is a cyclic wear leveling pointer.

4. The non-volatile memory system of claim 1, wherein, in response to the expected amount of remaining lifetime reaching a predetermined value, the control circuitry alters the operating behavior of the memory.

5. The system of claim 4, wherein, in response to the expected amount of remaining lifetime reaching a predetermined value, the control circuitry operates the memory in a read only mode.

6. The system of claim 4, wherein, in response to the expected amount of remaining lifetime reaching a predetermined value, the control circuitry alters memory block usage.

7. A non-volatile memory system, comprising:
a plurality of rewritable memory cells, where the memory cells each have a lifetime of a finite number of rewrite cycles;
rewrite circuitry connectable to said memory cells whereby the memory cells can be rewritten; and
control circuitry that maintains a parameter indicative of the number of rewrites the memory cells have undergone, determines an indication of the expected amount of remaining lifetime of the memory system based on the value of said parameter, and provides said indication of the expected amount of remaining lifetime to a host to which the memory is connected,
wherein the memory cells are physically arranged into a plurality of physical erase structures and the control circuitry monitors the number of spare erase structures, wherein the expected amount of remaining lifetime of the memory system is additionally based on the number of spare erase structures, and
wherein the providing an indication of the expected amount of remaining lifetime includes providing a warning to the host to which the memory is connected based upon a command including a current time value if the number of spare erase structure reaches a predetermined value.

8. A non-volatile memory system, comprising:
a plurality of rewritable memory cells, where the memory cells each have a lifetime of a finite number of rewrite cycles;
rewrite circuitry connectable to said memory cells whereby the memory cells can be rewritten; and
control circuitry that maintains a parameter indicative of the number of rewrites the memory cells have undergone, determines an indication of the expected amount of remaining lifetime of the memory system based on the value of said parameter, and provides said indication of the expected amount of remaining lifetime to a host to which the memory is connected,
wherein the expected amount of remaining lifetime of the memory system is additionally based on the peak write rate of the host to which the memory is connected.

9. A non-volatile memory system, comprising:
a plurality of rewritable memory cells, where the memory cells each have a lifetime of a finite number of rewrite cycles;
rewrite circuitry connectable to said memory cells whereby the memory cells can be rewritten; and
control circuitry that maintains a parameter indicative of the number of rewrites the memory cells have undergone, determines an indication of the expected amount of remaining lifetime of the memory system based on the value of said parameter, and provides said indication of the expected amount of remaining lifetime to a host to which the memory is connected,
wherein the rewrite process of the memory cells includes being erased prior to data content being rewritten and the rewrite circuitry includes erase circuitry, and said parameter is based upon a current number of erases per block of memory cells per period of time.

10. A non-volatile memory system, comprising:
a plurality of rewritable memory cells, where the memory cells each have a lifetime of a finite number of rewrite cycles;
rewrite circuitry connectable to said memory cells whereby the memory cells can be rewritten; and
control circuitry that maintains a parameter indicative of the number of rewrites the memory cells have undergone, determines an indication of the expected amount of remaining lifetime of the memory system based on the value of said parameter, and provides said indication of the expected amount of remaining lifetime to a host to which the memory is connected,
wherein the indication of the expected amount of remaining lifetime is provided as a percentage of total expected lifetime of the memory system and is based upon a current number of erases per block of memory cells per period of time.

11. A non-volatile memory system, comprising:
a plurality of rewritable memory cells, where the memory cells each have a lifetime of a finite number of rewrite cycles;
rewrite circuitry connectable to said memory cells whereby the memory cells can be rewritten; and
control circuitry that maintains a parameter indicative of the number of rewrites the memory cells have undergone, determines an indication of the expected amount of remaining lifetime of the memory system based on the value of said parameter, and provides said indication of the expected amount of remaining lifetime to a host to which the memory is connected,
wherein the indication of the expected amount of remaining lifetime is provided in units of real time based on current time values from the host.

12. The system of claim 11, said memory further comprising:
a system clock, wherein the providing an indication of the expected amount of remaining lifetime includes using the system to calculate the expected lifetime in units of real time.

13. The system of claim 11, wherein when the memory system is attached to a host, said providing an indication of the expected amount of remaining lifetime includes using a clock value from the host to calculate the expected lifetime in units of real time.

14. A non-volatile memory system, comprising:
a plurality of rewritable memory cells, where the memory cells each have a lifetime of a finite number of rewrite cycles;
rewrite circuitry connectable to said memory cells whereby the memory cells can be rewritten; and
control circuitry that maintains a parameter indicative of the number of rewrites the memory cells have undergone, determines an indication of the expected amount of remaining lifetime of the memory system based on the value of said parameter, and provides said indication of the expected amount of remaining lifetime to a host to which the memory is connected, wherein the indication of the expected amount of remaining lifetime is provided in units of real time,
wherein when the memory system is attached to the host, said providing an indication of the expected amount of remaining lifetime includes using a clock value from the host to calculate the expected lifetime in units of real time,
and wherein the indication of the expected amount of remaining lifetime of the memory system is provided to the host in response to a command from the host that includes said clock value.

15. A non-volatile memory system, comprising:
a plurality of rewritable memory cells, where the memory cells each have a lifetime of a finite number of rewrite cycles;
rewrite circuitry connectable to said memory cells whereby the memory cells can be rewritten; and
control circuitry that maintains a parameter indicative of the number of rewrites the memory cells have undergone, determines an indication of the expected amount of remaining lifetime of the memory system based on the value of said parameter, and provides said indication of the expected amount of remaining lifetime to a host to which the memory is connected,
wherein the providing an indication of the expected amount of remaining lifetime includes providing a warning if the expected amount of remaining lifetime reaches a predetermined value, and
wherein, in response to the expected amount of remaining lifetime reaching a predetermined value, the control circuitry alters the operating behavior of the memory,
wherein, in response to the expected amount of remaining lifetime reaching a predetermined value, the control circuitry operates the memory in a read only mode,
and wherein, in response to the expected amount of remaining lifetime reaching a predetermined value, the control circuitry alters an operation speed of the memory.

16. A system including:
a host; and
a non-volatile memory system connected to the host, comprising:
a plurality of rewritable memory cells, where the memory cells each have a lifetime of a finite number of rewrite cycles;
rewrite circuitry connectable to said memory cells whereby the memory cells can be rewritten; and
control circuitry that maintains a parameter indicative of the number of rewrites the memory cells have undergone, determines an indication of the expected amount of remaining lifetime of the memory system based on the value of said parameter, and provides to the host said indication of the expected amount of remaining lifetime to the host to which the memory is connected,
wherein said host provides status of said indication of the expected amount of remaining lifetime of the memory system to a user of the host,
wherein said status is provided as a status bar display, and
wherein said parameter is based upon a current number of erases per block of memory cells per period of time.

17. A system including:
a host; and
a non-volatile memory system connected to the host, comprising:
a plurality of rewritable memory cells, where the memory cells each have a lifetime of a finite number of rewrite cycles;
rewrite circuitry connectable to said memory cells whereby the memory cells can be rewritten; and
control circuitry that maintains a parameter indicative of the number of rewrites the memory cells have undergone, determines an indication of the expected amount of remaining lifetime of the memory system based on the value of said parameter, and provides to the host said indication of the expected amount of remaining lifetime to the host to which the memory is connected,
wherein, subsequent to providing said indication of the expected amount of remaining lifetime to the host, said control circuitry monitors the usage pattern of the memory system during operating and revises the expected amount of remaining lifetime of the memory system based on said usage pattern, and wherein when the memory system is attached to the host, said monitoring the usage pattern is performed using a current time value from the host.

18. The system of claim 17, said memory system further comprising:
a system clock, wherein said monitoring the usage pattern is performed using the system clock of the memory system.

19. A system including:
a host; and
a non-volatile memory system connected to the host, comprising:
a plurality of rewritable memory cells, where the memory cells each have a lifetime of a finite number of rewrite cycles;
rewrite circuitry connectable to said memory cells whereby the memory cells can be rewritten; and
control circuitry that maintains a parameter indicative of the number of rewrites the memory cells have undergone, determines an indication of the expected amount of remaining lifetime of the memory system based on the value of said parameter, and provides to the host said indication of the expected amount of remaining lifetime to the host to which the memory is connected,
wherein the expected amount of remaining lifetime of the memory system is additionally based on the peak write rate of the host.

20. A system including:
a host; and
a non-volatile memory system connected to the host, comprising:
a plurality of rewritable memory cells, where the memory cells each have a lifetime of a finite number of rewrite cycles;
rewrite circuitry connectable to said memory cells whereby the memory cells can be rewritten; and
control circuitry that maintains a parameter indicative of the number of rewrites the memory cells have undergone, determines an indication of the expected amount of remaining lifetime of the memory system based on the value of said parameter, and provides to the host said indication of the expected amount of remaining lifetime to the host to which the memory is connected,
wherein the indication of the expected amount of remaining lifetime is provided in units of real time based on current time values from the host.

21. The system of claim 20, said memory further comprising:
a system clock, wherein the providing an indication of the expected amount of remaining lifetime includes using the system to calculate the expected lifetime in units of real time.

22. The system of claim 20, wherein the host comprises a clock and wherein said providing an indication of the expected amount of remaining lifetime includes using a clock value from the host to calculate the expected lifetime in units of real time.

23. A system including:
a host; and
a non-volatile memory system connected to the host, comprising:
a plurality of rewritable memory cells, where the memory cells each have a lifetime of a finite number of rewrite cycles;
rewrite circuitry connectable to said memory cells whereby the memory cells can be rewritten; and
control circuitry that maintains a parameter indicative of the number of rewrites the memory cells have undergone, determines an indication of the expected amount of remaining lifetime of the memory system based on the value of said parameter, and provides to the host said indication of the expected amount of remaining lifetime to the host to which the memory is connected,
wherein the indication of the expected amount of remaining lifetime is provided in units of real time,
wherein the host comprises a clock and wherein said providing an indication of the expected amount of remaining lifetime includes using a clock value from the host to calculate the expected lifetime in units of real time, and
wherein the indication of the expected amount of remaining lifetime of the memory system is provided to the host in response to a command from the host that includes said clock value.

24. The system of claim 23, wherein the providing an indication of the expected amount of remaining lifetime includes providing a warning if the expected amount of remaining lifetime reaches a predetermined value.

25. The system of claim 24, wherein said host provides an indication of said warning to a user of the host.

26. The system of claim 24, wherein the host passes said warning to one or more applications on the host.

27. The system of claim 26, wherein the host shuts down one or more of said applications in response to said warning.

28. The system of claim 24, wherein in response to said warning, the host activating a back-up process.

29. The system of claim 24, wherein in response to said warning, the host shuts down.

30. A non-volatile memory system for use with a host, comprising:
a plurality of rewritable memory cells, where the memory cells each have a lifetime of a finite number of rewrite cycles;
rewrite circuitry connectable to said memory cells whereby the memory cells can be rewritten;
read circuitry connectable to said memory cells to read the data content therein;
control circuitry, including ECC circuitry for determining a level of error associated with a group of memory cells being read, wherein the control circuitry determines an indication of the expected amount of remaining lifetime of the memory system based on said level of error, and
an interface, whereby said indication of the expected amount of remaining lifetime can be provided to the host to which the memory is connected,
wherein, subsequent to providing said indication of the expected amount of remaining lifetime to the host, said control circuitry monitors the usage pattern of the memory system during operating and revises the expected amount of remaining lifetime of the memory system based on said usage pattern, and wherein when the memory system is attached to the host, said monitoring the usage pattern is performed using a current time value from the host.

31. A system, comprising:
a host, including an interface for the attachment of memory devices through which the host can supply current time values to a memory device attached thereto; and
one or more memory devices detachably connectable to the host, each of the memory devices including:
a plurality of rewritable memory cells, where the memory cells each have a lifetime of a finite number of rewrite cycles;
rewrite circuitry connectable to said memory cells whereby the memory cells can be rewritten; and
control circuitry that maintains a usage rate for the memory device and determines an indication of remaining life of the memory device in real time units based on the usage rate and a plurality of current time values received from the host when attached thereto.

32. The system of claim 31, wherein each of said memory devices send an indication of remaining life in real time units to the host when attached thereto.

33. The system of claim 32, wherein said indication is sent in response to a command from the host that also includes a current time values.

34. The system of claim 31, wherein each of the memory devices has an associated ID by which the host distinguishes the memory devices.

35. The system of claim 31, wherein the host monitors the usage pattern of a memory device attached thereto and the usage pattern influences when the host sends current time values to said memory device attached thereto.

36. A system, comprising:
a host, including an interface for the attachment of memory devices through which the host can supply current time values to a memory device attached thereto; and
one or more memory devices detachably connectable to the host, each of the memory devices including:
a plurality of rewritable memory cells, where the memory cells each have a lifetime of a finite number of rewrite cycles;
rewrite circuitry connectable to said memory cells whereby the memory cells can be rewritten; and
control circuitry that maintains a level for the memory device and transmits to the when attached thereto said a plurality of current time values,
wherein the host receives an indication of remaining life of the memory device attached thereto in real time units based on said plurality of current time values and the wear level values for the first memory device.

37. The system of claim 36, wherein the memory device sends the value of the wear level at the plurality of current time values to the host in response to a command from the host.

38. The system of claim 36, wherein each of the memory devices has an associated ID by which the host distinguishes the memory devices.

* * * * *